United States Patent
Cai et al.

(10) Patent No.: US 12,543,385 B2
(45) Date of Patent: Feb. 3, 2026

(54) SINGLE-PHOTON AVALANCHE DIODE WITH ISOLATED JUNCTIONS

(71) Applicant: GlobalFoundries Singapore Pte. Ltd., Singapore (SG)

(72) Inventors: Xinshu Cai, Singapore (SG); Shyue Seng Tan, Singapore (SG); Eng Huat Toh, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 711 days.

(21) Appl. No.: 17/943,638

(22) Filed: Sep. 13, 2022

(65) Prior Publication Data

US 2024/0088173 A1 Mar. 14, 2024

(51) Int. Cl.
*H10F 39/10* (2025.01)
*H10F 30/225* (2025.01)
*H10F 71/00* (2025.01)

(52) U.S. Cl.
CPC ........ *H10F 39/103* (2025.01); *H10F 30/225* (2025.01); *H10F 71/00* (2025.01)

(58) Field of Classification Search
CPC ....... H10F 39/103; H10F 30/225; H10F 71/00
See application file for complete search history.

(56) References Cited

U.S. PATENT DOCUMENTS

| 5,894,152 | A | 4/1999 | Jaso et al. |
| 10,438,987 | B2 | 10/2019 | Mandai et al. |
| 10,672,818 | B2 | 6/2020 | Tanaka et al. |
| 2004/0178465 | A1* | 9/2004 | Merrill .................. H10F 39/802 257/443 |
| 2022/0254946 | A1* | 8/2022 | Park ...................... H10F 30/225 |
| 2023/0065873 | A1* | 3/2023 | Lee ...................... H10F 39/8063 |

FOREIGN PATENT DOCUMENTS

| CN | 114038865 | A | * | 2/2022 |
| CN | 114914325 | A | * | 8/2022 |
| CN | 114975657 | A | * | 8/2022 |

OTHER PUBLICATIONS

Robert K. Henderson et al., "A Dual-Junction Single-Photon Avalanche Diode in 130-nm CMOS Technology", IEEE Electron Device Letters, vol. 34, No. 3, Mar. 2013, 3 pages.

M. M. Vignetti et al., "A novel 3D pixel concept for Geiger-mode detection in SOI technology", 2016 Joint International EUROSOI Workshop and International Conference on Ultimate Integration on Silicon (EUROSOI-ULIS), 2016, doi: 10.1109/ULIS.2016.7440079., 4 pages.

* cited by examiner

*Primary Examiner* — Britt D Hanley
*Assistant Examiner* — Jason James Greaving
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a single-photon avalanche diode with isolated junctions and methods of manufacture. The structure includes a first p-n junction in a semiconductor material; and a second p-n junction in a second semiconductor material isolated from the first p-n junction by a buried insulator layer.

18 Claims, 5 Drawing Sheets

SINGLE-PHOTON AVALANCHE DIODE WITH ISOLATED JUNCTIONS

BACKGROUND

The present disclosure relates to semiconductor structures and, more particularly, to a single-photon avalanche diode with isolated junctions and methods of manufacture.

A single-photon avalanche diode (SPAD) is a solid-state photodetector which exhibits basic diode behavior. As with photodiodes, a SPAD is based around a semiconductor p-n junction that can be illuminated with ionizing radiation along a wide portion of the electromagnetic spectrum from ultraviolet (UV) through the visible wavelengths and into the infrared (IR).

In a SPAD, the reverse bias is very high such that a phenomenon called impact ionization occurs. This phenomenon is able to cause an avalanche current to develop. Generally, a photo-generated carrier is accelerated by the electric field in the device to a kinetic energy which is enough to overcome the ionization energy of bulk material, knocking electrons out of an atom. A large avalanche of current carriers grows exponentially and can be triggered from as few as a single photon-initiated carrier. A SPAD is able to detect single photons providing short duration trigger pulses that can be counted, and can also be used to obtain the time of arrival of the incident photon due to the high speed that the avalanche builds up and the device's low timing jitter.

The SPAD is biased well above its reverse-bias breakdown voltage and has a structure that allows operation without damage or undue noise. However, conventional back-to-back avalanche diode schemes have difficulties in optimizing p-n junction depth. Also, conventional back-to-back avalanche diode schemes suffer disturbs between two junctions. Moreover, dual junctions share a deep N-well and thus cannot independently optimize excess bias.

SUMMARY

In an aspect of the disclosure, a structure comprises: a first p-n junction in a semiconductor material; and a second p-n junction in a second semiconductor material isolated from the first p-n junction by a buried insulator layer.

In an aspect of the disclosure, a structure comprises: a first p-n junction in a semiconductor on insulator substrate; a second p-n junction in a bulk semiconductor material under the first p-n junction; a buried insulator layer isolating the first p-n junction from the second p-n junction; and shallow trench isolation structures extending to the buried insulator layer and surrounding the first p-n junction.

In an aspect of the disclosure, a method comprises: forming a first p-n junction in a semiconductor material; and forming a second p-n junction in a second semiconductor material isolated from the first p-n junction.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a single-photon avalanche diode (SPAD) with isolated junctions and methods of manufacture. More specifically, the present disclosure is directed to a buried dual junction SPAD based on semiconductor-on-insulator (SOI) technologies. Advantageously, the SPAD with the isolated junctions eliminates disturb/crosstalk, improves photon detection efficiency (PDE), and provides higher flexibility of optimization for multiple wavelength detections.

In more specific embodiments, the SPAD includes dual isolated avalanche diodes. The SPAD may be isolated by a buried insulator layer, e.g., buried oxide layer (BOX) of SOI technology, and a dual shallow isolation structure scheme. For example, the buried insulator layer and shallow trench isolation scheme effectively isolate individual SPADs from each other, eliminating disturbs for multiple wavelengths detection. In addition, excess bias of each SPAD can be optimized.

In embodiments, the structure comprises a first p-n junction in a semiconductor layer of the SOI technology, isolated on sides by the dual shallow isolation structure scheme and at a bottom by the underlying insulator layer (e.g., BOX). The underlying insulator layer may also isolate a second p-n junction in a bulk substrate from the first p-n junction. In this scheme, the second p-n junction in the bulk substrate is underneath the first p-n junction. In further embodiments, a third p-n junction may be under the second p-n junction. With a separated back-to-back diode scheme, individual avalanche diode junction depths can be optimized to achieve higher Photon Detection Efficiency (PDE) and reduced disturbs.

The SPADs of the present disclosure can be manufactured in a number of ways using a number of different tools. In general, though, the methodologies and tools are used to form structures with dimensions in the micrometer and nanometer scale. The methodologies, i.e., technologies, employed to manufacture the SPADs of the present disclosure have been adopted from integrated circuit (IC) technology. For example, the structures are built on wafers and are realized in films of material patterned by photolithographic processes on the top of a wafer. In particular, the fabrication of the SPADs uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
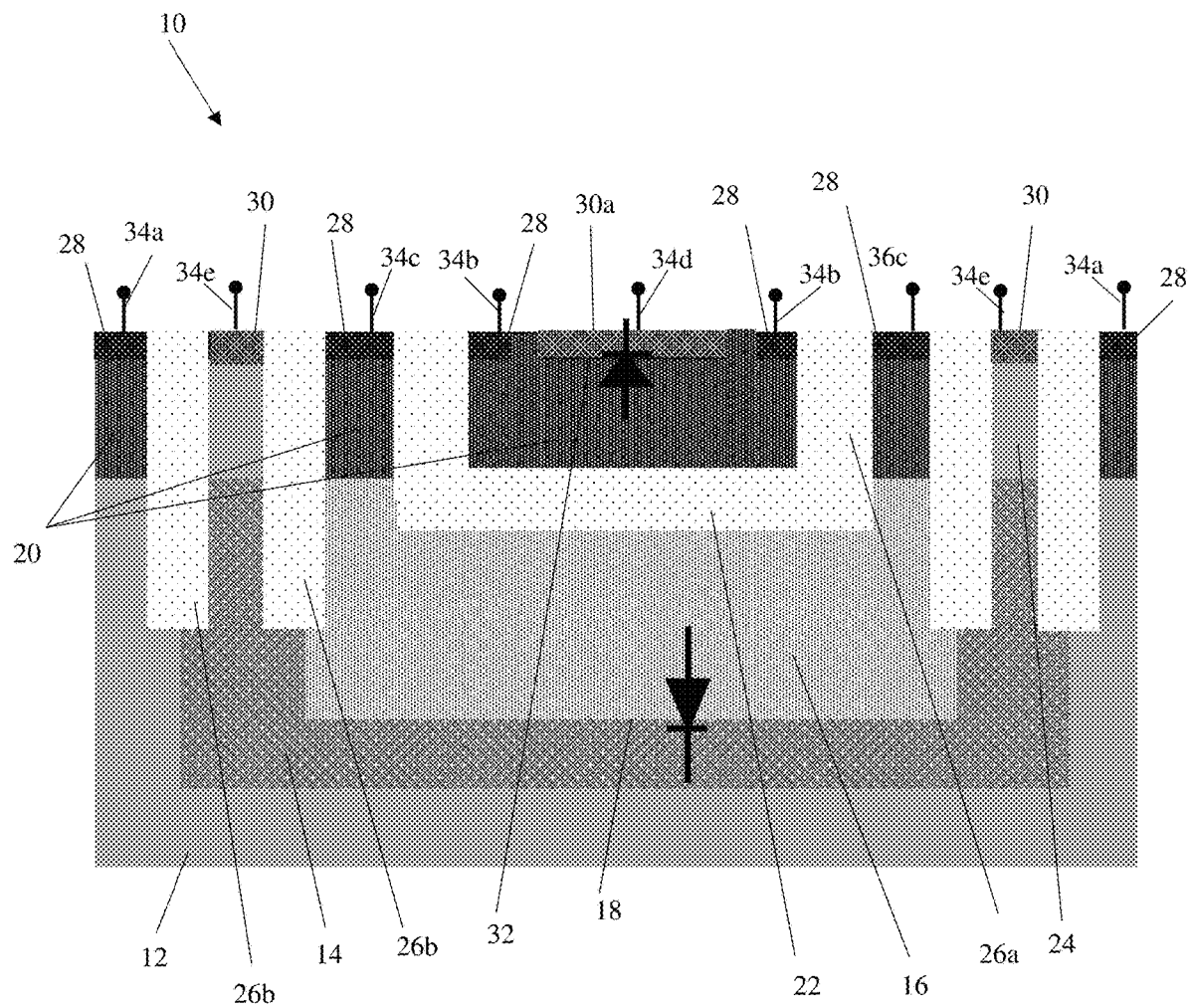
FIG. 1 shows back-to-back SPADs and respective fabrication processes in accordance with aspects of the present disclosure.

FIG. 1 shows back-to-back SPADs and respective fabrication processes in accordance with aspects of the present disclosure. More specifically, the structure 10 of FIG. 1 includes a semiconductor substrate 12. In embodiments, the semiconductor substrate 12 may be a bulk semiconductor material used in SOI technologies. In more specific embodiments, the semiconductor substrate 12 may be a bulk handle substrate for SOI technology as described in further detail herein. For example, the semiconductor substrate 12 may be composed of any suitable material including, but not limited to, Si, SiGe, SiGeC, SiC, GaAs, InAs, InP, and other III/V or II/VI compound semiconductors. The semiconductor substrate 12 may be a p-type substrate.

Still referring to FIG. 1, a deep N-well 14 may be formed in the semiconductor substrate 12. In embodiments, the deep N-well 14 may be formed by a conventional ion implantation process. For example, the deep N-well 14 may be formed by introducing an n-type dopant in the semiconductor substrate 12 using an ion implantation process. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The N-well 14 is doped with n-type dopants, e.g., Arsenic (As), Phosphorus (P) and Antimony (Sb), among other suitable examples.

A high-voltage deep P-well (HVDPW) 16 may be formed in the semiconductor substrate 12 within the N-well 14. The HVDPW 16 may be formed by introducing a concentration of p-type dopant in the semiconductor substrate 12 using conventional ion implantation processes as already described herein. In embodiments, the p-type dopant may be, e.g., Boron (B). A SPAD 18, e.g., diode, at the p-n junction formed between the deep N-well 14 and the HVDPW 16.

A P-well 20 may formed in the semiconductor substrate 12 partially above a buried insulator layer 22. In embodiments, the buried insulator layer 22 may be a buried oxide layer (BOX) used in SOI technologies. The P-well 20 may also extend over the HVDPW 16 and the semiconductor substrate 12. In embodiments, the P-well 20 may be formed by introducing a concentration of p-type dopant in the semiconductor substrate 12 using conventional ion implantation processes as already described herein. In embodiments, the p-type dopant may be, e.g., Boron (B). An N-well 24 may be formed between the P-well 20 by introducing a concentration of n-type dopant in the semiconductor substrate 12 using conventional ion implantation processes as described herein.

The P-well 20 and the N-well 24 may be separated by shallow trench isolation structures 26b. In addition, shallow trench isolation structure 26a may be formed within the P-well 20 extending to and contacting the underlying buried insulator layer 22. In this way, the combination of the shallow trench isolation structure 26a and the underlying buried insulator layer 22 may isolate a SPAD 32, e.g., diode, formed at the p-n junction of the P-well 20 and an N+ diffusion region 30a. Accordingly, the SPAD 32 may be isolated from the SPAD 18 by the combination of the shallow trench isolation structure 26a and the underlying buried insulator layer 22.

In embodiments, the shallow trench isolation structures 26a, 26b can be formed by conventional lithography, etching and deposition methods known to those of skill in the art. For example, a resist formed over the semiconductor substate 12 is exposed to energy (light) and developed to form a pattern (opening). An etching process with a selective chemistry, e.g., reactive ion etching (RIE), will be used to transfer the pattern from the photoresist layer to the semiconductor substate 12 thereby forming one or more trenches in the semiconductor substrate 12 through the openings of the resist. Following the resist removal by a conventional oxygen ashing process or other known stripants, insulator material, e.g., silicon dioxide, can be deposited by any conventional deposition processes, e.g., chemical vapor deposition (CVD) processes. Any residual material on the surface of the semiconductor substate 12 can be removed by conventional chemical mechanical polishing (CMP) processes.

FIG. 1 further shows P+ diffusion regions 28 formed in the P-well 20 and N+ diffusion regions 30 formed in the N-well 24. The P+ diffusion regions 28 and N+ diffusion regions 30 (and N+ diffusion region 30a) may be formed by conventional ion implantation processes as already described herein.

Terminals 34a, 34b, 34c, 34d, 34e may be formed in contact to the P+ diffusion regions 28 and N+ diffusion regions 30, 30a. In embodiments, the terminals 34a, 34b, 34c, 34d, 34e may be metallization features formed by conventional back end of the line processes, e.g., lithography, etching and deposition methods known to those of skill in the art such that no further description is required for a complete understanding of the present disclosure.

In more specific embodiments, the terminals 34a may connect ground to the P-well 20 through the P+ diffusion region 28. The terminals 34b may connect the P-well 20 (isolated by the underlying buried insulator layer 22 and the shallow trench isolation structure 26a) to a first anode through the P+ diffusion region 28. The terminals 34c may connect the P-well 20 (isolated by the shallow trench isolation structure 26b) to a second anode through the P+ diffusion region 28. The terminals 34d may connect the N+ diffusion region 30a (e.g., isolated by the combination of the shallow trench isolation structure 26a and the underlying buried insulator layer 22) to a first cathode. Terminal 34e may connect the N+ diffusion region 30 (e.g., isolated by the shallow trench isolation structure 26b) to a second cathode.

Figure 2:
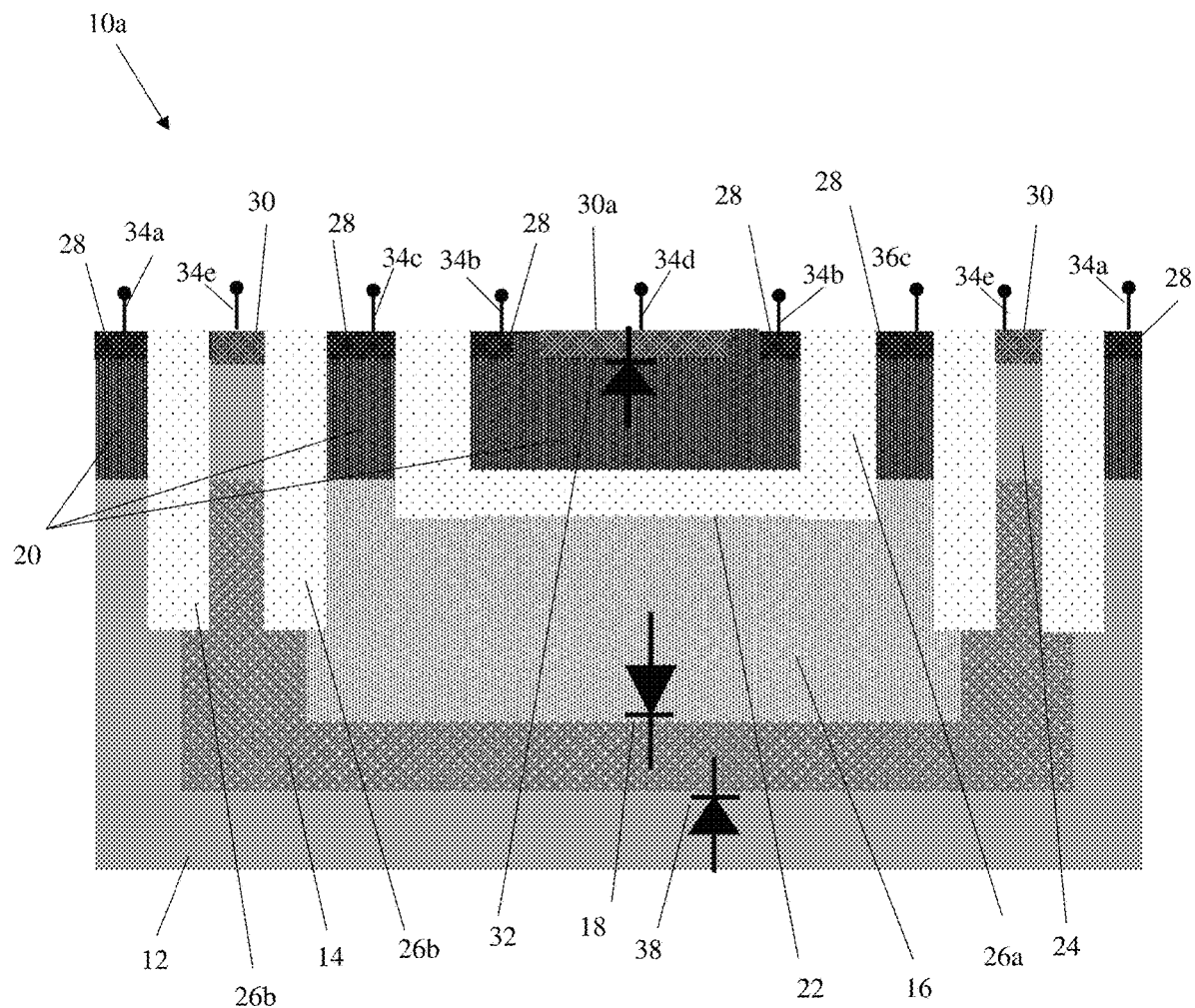
FIG. 2 shows back-to-back-to-back SPADs in accordance with additional aspects of the present disclosure.

FIG. 2 shows back-to-back-to-back SPADs in accordance with additional aspects of the present disclosure. In the structure 10a of FIG. 2, a third SPAD 38, e.g., diode, is provided at the p-n junction between the semiconductor substrate 12 and the deep N-well 14. In this embodiment, both the SPADs 18 and 38 are isolated from the SPAD 32 by the combination of the shallow trench isolation structures 26a and the buried insulator layer 22; whereas the SPAD 18 and SPAD 38 are vertically spaced apart and not isolated from one another. The remaining features are similar to the structure 10 shown in FIG. 1.

FIGS. 3A-3E show fabrication processes for manufacturing the back-to-back SPADs of FIG. 1. A similar process may be used for manufacturing the back-to-back-to-back SPADs of FIG. 2.

Figure 3A:
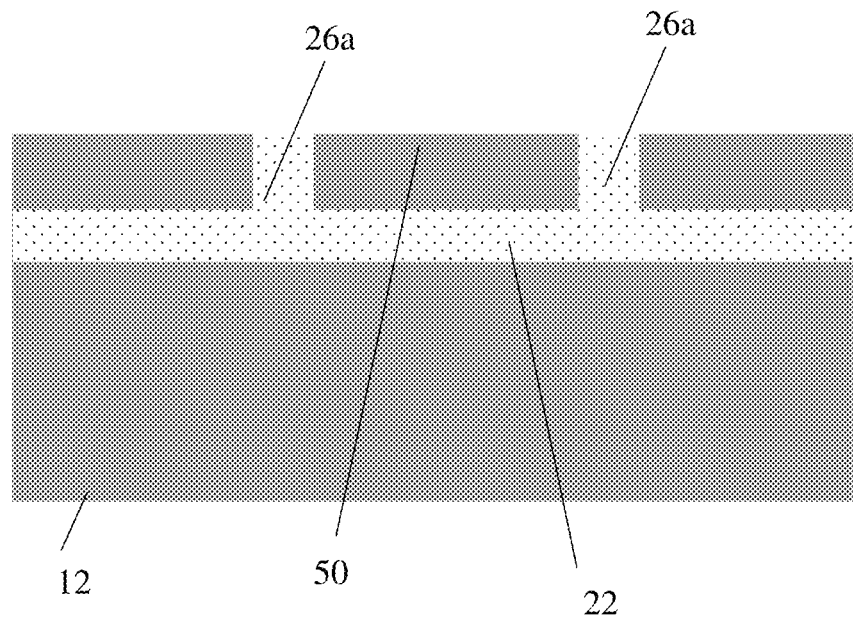
FIGS. 3A-3E show fabrication processes for manufacturing the back-to-back SPADs of FIG. 1.

More specifically, FIG. 3A shows a SOI substrate comprising the semiconductor substrate 12, buried insulator layer 22 and a semiconductor layer 50. The semiconductor layer 50 may be used to form the P-well 20 which is isolated by the shallow trench isolation structures 26a and the buried insulator layer 22 as shown in FIG. 1. In embodiments, the shallow trench isolation structures 26a are formed by conventional lithography, etching and deposition methods as already described herein. The shallow trench isolation structures 26a extend to the buried insulator layer 22.

Figure 3B:
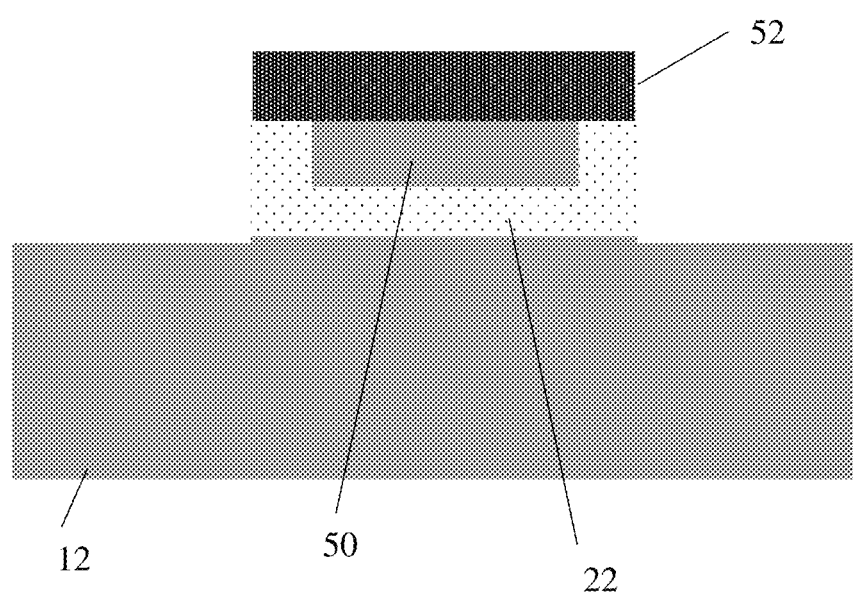

In FIG. 3B, masks or pad layers 52 are patterned over the semiconductor layer 50 and between the shallow trench isolation structures 26a. In embodiments, the masks or pad layers 52 may be patterned by using conventional lithography and etching processes as are known in the art. The exposed portions of the semiconductor layer 50 and portions of the underlying buried insulator layer 22 are removed, leaving the shallow trench isolation structures 26a and the semiconductor layer 50 between the shallow trench isolation structures 26a. In embodiments, the underlying semiconductor substrate 12 may also be exposed. The semiconductor layer 50 and buried insulator layer 22 may be removed by etching processes, with respective chemistries selective to the semiconductor layer 50 and buried insulator layer 22.

Figure 3C:
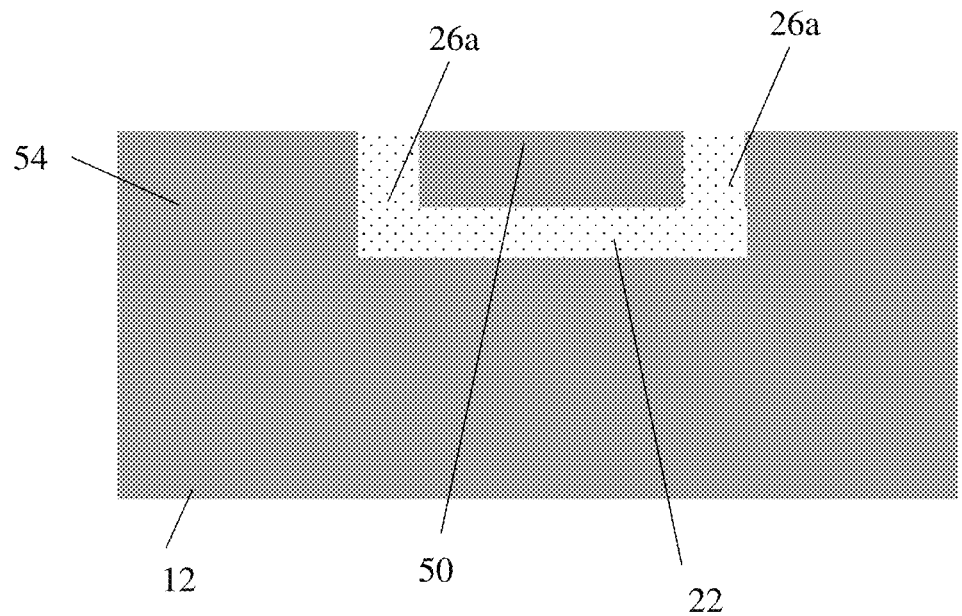

In FIG. 3C, additional semiconductor material 54 may be grown on the exposed semiconductor substrate 12. In embodiments, the additional semiconductor material 54 may have the same semiconductor composition as the semiconductor substrate 12. The masks or pad layers 52 may be removed using conventional stripping processes, e.g., CMP or other etching processes.

Figure 3D:
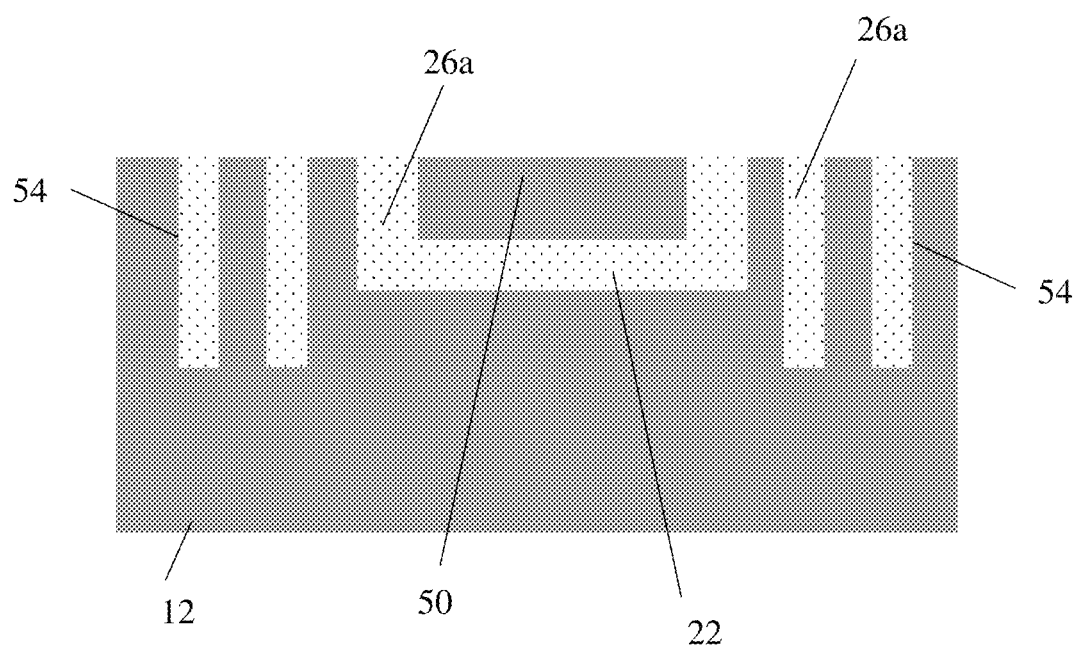

In FIG. 3D, the shallow trench isolation structures 26b may be formed within the additional semiconductor material 54. In embodiments, the shallow trench isolation structures 26b may extend into the semiconductor substrate 12. As described above, the shallow trench isolation structures 26b may be formed by conventional lithography, etching and deposition methods.

Figure 3E:
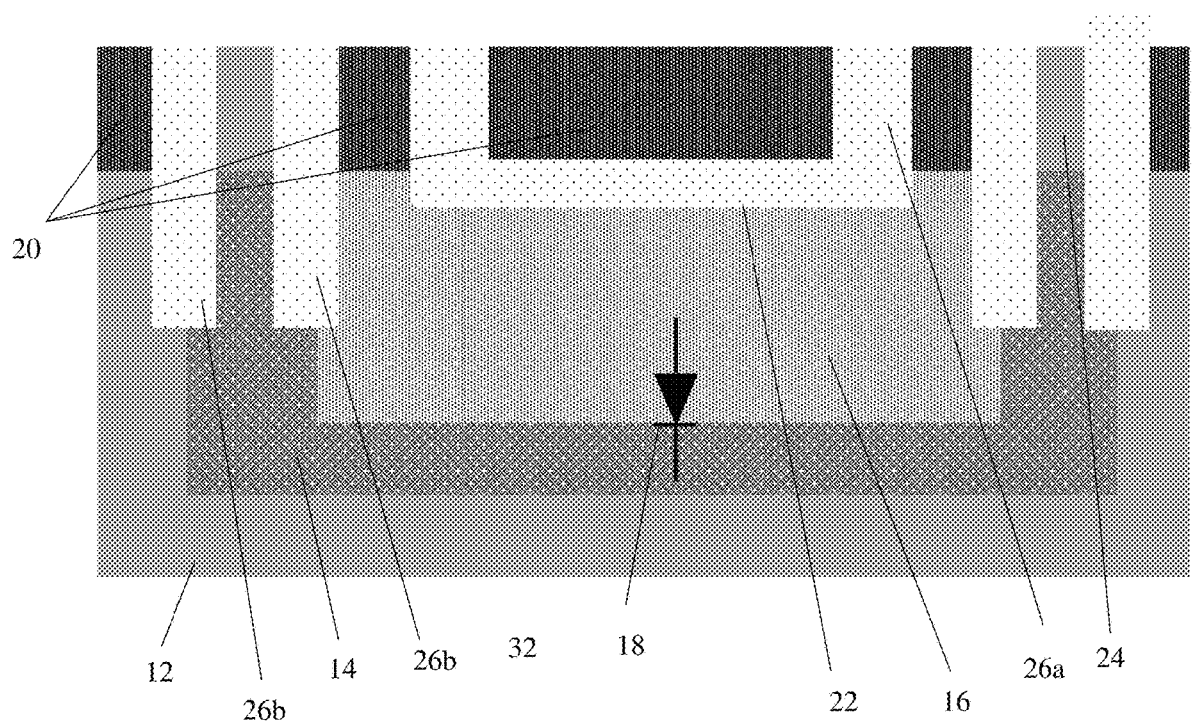

In FIG. 3E, the wells 14, 16, 20, 24 may formed by ion implantation processes as described above. In embodiments, each of the wells 14, 16, 20, 24 may be formed separately with separate masks. For example, respective patterned implantation masks may be used to define selected areas exposed for the separate implantations. The implantation mask used to select the exposed area for forming a particular well is stripped after implantation, and before the implantation mask used to form another well. Similarly, the implantation mask used to select the exposed area for forming the other well is stripped after the implantation is performed.

Referring back to FIG. 1, P+ diffusion regions 28 may be formed in the P-well 20 and N+ diffusion regions 30 may be formed in the N-well 24. The P+ diffusion regions 28 and N+ diffusion regions 30 (and N+ diffusion region 30a) may be formed by conventional ion implantation processes as already described herein.

Prior to formation of the terminals 34a, 34b, 34c, 34d, 34e, the P+ diffusion region 28 and N+ diffusion regions 30, 30a may undergo a silicide process. As should be understood by those of skill in the art, the silicide process begins with deposition of a thin transition metal layer, e.g., nickel, cobalt or titanium, over the P+ diffusion region 28 and N+ diffusion regions 30, 30a. After deposition of the material, the structure is heated allowing the transition metal to react with exposed silicon (or other semiconductor material as described herein) on the P+ diffusion region 28 and N+ diffusion regions 30, 30a forming a low-resistance transition metal silicide. Following the reaction, any remaining transition metal is removed by chemical etching, leaving silicide contacts on the P+ diffusion region 28 and N+ diffusion regions 30, 30a. In embodiments, a silicide block region (where no silicide is formed) may be provided between the p+ diffusion layer 28 and the n+ diffusion layer 30a for isolation purpose. The terminals may then be formed over the silicide contacts in the P+ diffusion region 28 and N+ diffusion regions 30, 30a.

The terminals 34a, 34b, 34c, 34d, 34e may be formed by conventional back end of the line processes. For example, a dielectric material may be deposited over the P+ diffusion regions 28 and N+ diffusion regions 30, 30a, followed by a patterning process to form trenches exposing the silicide contacts of the P+ diffusion regions 28 and N+ diffusion regions 30, 30a. The patterning process may be conventional lithography and etching processes, followed by a deposition of metal or metal alloys within the trenches to form the terminals 34a, 34b, 34c, 34d, 34e. In embodiments, the trenches can be lined with a barrier material, e.g., TaN or TiN, followed by deposition of tungsten. Any excess metal can be removed from the dielectric material using a conventional CMP process. The dielectric material may be a layers of oxide and nitride, as examples, deposited by a CVD process.

The SPAD can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a first p-n junction in a semiconductor material; and
a second p-n junction in a second semiconductor material isolated from the first p-n junction by a buried insulator layer;
a third p-n junction under the second p-n junction,
wherein the first p-n junction is isolated from the third p-n junction and the second p-n junction and the third p-n junction are not isolated from one another.

2. The structure of claim 1, wherein the first p-n junction is isolated from the second p-n junction by the buried insulator layer and shallow trench isolation structures.

3. The structure of claim 2, wherein the semiconductor material comprises a semiconductor on insulator substrate and the second semiconductor material comprises a bulk handle substrate.

4. The structure of claim 3, wherein the buried insulator layer comprises a buried oxide material between the semiconductor on insulator substrate and the bulk handle substrate.

5. The structure of claim 3, wherein the second p-n junction is under the first p-n junction.

6. The structure of claim 3, wherein the first p-n junction comprises a first single-photon avalanche diode and the second p-n junction comprises a second single-photon avalanche diode.

7. The structure of claim 3, wherein the first p-n junction comprises a P-well and an N+ diffusion in the semiconductor on insulator substrate and the second p-n junction comprises a deep N-well and a deep P-well in the bulk handle substrate.

8. The structure of claim 7, wherein the deep P-well comprises a high voltage deep P-well under a buried oxide layer of the semiconductor on insulator substrate.

9. The structure of claim 1, wherein the third p-n junction comprises the bulk handle substrate and the deep N-well in the bulk handle substrate.

10. The structure of claim 1, wherein the second p-n junction and the third p-n junction are vertically arranged.

11. A structure comprising:
    a first p-n junction in a semiconductor on insulator substrate;
    a second p-n junction in a bulk semiconductor material under the first p-n junction;
    a buried insulator layer isolating the first p-n junction from the second p-n junction;
    a third p-n junction under the second p-n junction; and
    shallow trench isolation structures which extend to the buried insulator layer and surround the first p-n junction,
    wherein the first p-n junction is isolated and the second and third junction structures are not isolated from one another.

12. The structure of claim 11, wherein the first p-n junction is isolated from the second p-n junction by the buried insulator layer and the shallow trench isolation structures.

13. The structure of claim 11, wherein the first p-n junction further comprises a P-well wherein the first p-n junction comprises a portion of the P-well and N+ diffusion in the semiconductor on insulator substrate and the second p-n junction comprises a deep N-well and a deep P-well in a bulk substrate under the buried insulator layer.

14. The structure of claim 13, further comprising anode terminals connected to the P-well and cathode terminals connected to an N-well extended into the deep N-well and separated from the P-well by second shallow trench isolation structures.

15. The structure of claim 13, wherein the P-well further connects to ground terminals.

16. The structure of claim 15, wherein the P-well connected to the ground terminals are separated from the N-well connected to the cathode terminals by additional shallow trench isolation structures.

17. The structure of claim 11, wherein the third p-n junction isolated from the first p-n junction.

18. A method comprising:
    forming a first p-n junction in a semiconductor material; and
    forming a second p-n junction in a second semiconductor material isolated from the first p-n junction; and
    forming a third p-n junction under the second p-n junction,
    wherein the first p-n junction is isolated from the third p-n junction and the second p-n junction and the third p-n junction are not isolated from one another.

* * * * *